(12) United States Patent
Zacherl et al.

(10) Patent No.: US 7,229,857 B2
(45) Date of Patent: Jun. 12, 2007

(54) METHOD FOR PRODUCING A PROTECTION FOR CHIP EDGES AND SYSTEM FOR THE PROTECTION OF CHIP EDGES

(75) Inventors: Juergen Zacherl, Donaustauf (DE); Martin Reiss, Ottendorf-Okrilla OT Medingen (DE); Stephan Blaszczak, Freyburg (DE)

(73) Assignee: Infineon Technologies AG, Munich (DE)

( * ) Notice: Subject to any disclaimer, the term of this patent is extended or adjusted under 35 U.S.C. 154(b) by 130 days.

(21) Appl. No.: 10/890,827

(22) Filed: Jul. 14, 2004

(65) Prior Publication Data

US 2005/0064630 A1    Mar. 24, 2005

Related U.S. Application Data

(63) Continuation of application No. PCT/DE03/00012, filed on Jan. 7, 2003.

(30) Foreign Application Priority Data

Jan. 14, 2002    (DE) ................. 102 01 204

(51) Int. Cl.
*H01L 21/00*    (2006.01)

(52) U.S. Cl. ................. 438/127; 257/789; 438/126

(58) Field of Classification Search .......... 438/126, 438/127, 789; 257/789, 791, 793
See application file for complete search history.

(56) References Cited

U.S. PATENT DOCUMENTS

| | | | |
|---|---|---|---|
| 5,293,067 A | 3/1994 | Thompson et al. | |
| 5,659,952 A | 8/1997 | Kovac et al. | |
| 5,920,118 A | 7/1999 | Kong | |
| 6,124,546 A | 9/2000 | Hayward et al. | |
| 6,225,144 B1 | 5/2001 | How et al. | |
| 2001/0046120 A1 | 11/2001 | Lo et al. | |
| 2003/0082925 A1* | 5/2003 | Yano et al. ................. 438/778 |

FOREIGN PATENT DOCUMENTS

WO    WO 03/058704 A1 *    7/2003

OTHER PUBLICATIONS

Garti, Nissim, "New Non-Stick Epoxy-Silicon Water-Based Coatings, Part 1: Physical and Surface Properties," Proceedings of the Fifth Inernational Zebra Mussel and Other Aquatic Nuisance Organisms Conference, Toronto, Canada, Feb. 1995.*

* cited by examiner

*Primary Examiner*—Mary Wilczewsld
*Assistant Examiner*—Seth Barnes
(74) *Attorney, Agent, or Firm*—Slater & Matsil, L.L.P.

(57) ABSTRACT

The invention relates to a method for producing a protection for the chip edges of electronic components that are not provided with a housing, according to which semiconductor chips provided with a laterally open bonding channel are mounted on a substrate with a tape interposed between. The invention further relates to a system for protecting chip edges.

13 Claims, 2 Drawing Sheets

METHOD FOR PRODUCING A PROTECTION FOR CHIP EDGES AND SYSTEM FOR THE PROTECTION OF CHIP EDGES

This application is a continuation of PCT application PCT/DE03/00012, filed on Jan. 7, 2003 and published in German on Jul. 17, 2003, which application claims priority to German patent application 102 01 204.0, filed Jan. 14, 2002. Both of these applications are incorporated herein by reference.

TECHNICAL FIELD

The invention relates to a method for producing a protection for chip edges and a system for the protection of chip edges.

BACKGROUND

It is known that unprotected chip edges, in particular and in addition their corners, are extremely sensitive to mechanical loads, for example shocks. The resultant damage results in high failure rates during handling. In addition, any thermal/mechanical mismatch between the materials that are used for the electronic components can frequently lead to mechanical stress at the chip edges and at their corners, and in the process can lead to damage. Furthermore, unprotected fuses, which should be understood as meaning electrical fuses, e.g., for the provision of redundancy, are very sensitive to environmental influences, such as moisture and ions, and can thus corrode very easily.

In order to reduce or to avoid these problems, various more or less complex methods and arrangements for protection of the semiconductor chips have become known. For example, it is possible to dispense an underfiller around the chip edges, in order to protect them. See U.S. Pat. No. 5,920,118. A suitable interposer can also be used, or else a suitable plastic can be printed, or else the electronic component can be encapsulated (molded) in order to achieve complete protection for the semiconductor chip.

U.S. Pat. No. 6,225,144 describes a method and a device for underfilling the intermediate space between a chip and a substrate with an underfilling material. U.S. Pat. No. 5,659,952 describes the production of a compliant interface for a semiconductor chip which is electrically connected to a substrate by means of solder balls. Here, the intermediate space between the chip and the substrate is filled with a compliant filling compound.

However, it has been found that the effects of the thermomechanical stresses, which occur during operation of the electronic components cannot be effectively counteracted by the described methods.

Attempts have also been made to reduce thermomechanical stresses by suitable selection of the components, as has been described for a chip-scale (CSP) component in US Patent Application No. 2001/0046120.

Another possible way to reduce thermomechanical stress is described, for example, in U.S. Pat. No. 5,293,067, which describes a chip mount for integrated circuits, in which a semiconductor chip is connected electrically and at the same time mechanically to a substrate via bumps (solder balls) and contact islands (pads). In order to achieve a better mechanical connection between the semiconductor chip and the substrate as well, the intermediate space between the components is filled with an organic connecting means (underfiller), such as an epoxy resin or silicone. This underfiller is also intended to be used to reduce mechanical loads (stress) between the semiconductor chip and the substrate. Furthermore, the underfiller also has the function of protecting the active areas and the electrical connections against environmental influences. Depending on the application, the underfiller may in this case fill the entire intermediate space between the components, or possibly only the area of the active surface of the semiconductor chip. However, effective edge protection for the semiconductor chip is not possible with this arrangement.

A completely different embodiment of a sheath for a semiconductor chip is described in U.S. Pat. No. 6,124,546. In this case, a semiconductor chip is mounted on the interconnects of an upper interposer by means of solder balls. Two or more spacers composed of an insulator material, for example an elastomer, are arranged on the rear face of the chip, and a second interposer is mounted on them, which is at the same time provided with external contacts (BGA) for making contact between the module and printed circuit boards, etc. The intermediate space between the two interposers is filled with an encapsulating compound. Since the semiconductor chip is in this case surrounded on all sides, this encapsulation admittedly provides good protection for the semiconductor chip, but even this does not ensure adequate protection against thermomechanical loads. A further disadvantage is that it is impossible to achieve particularly small dimensions, for example in the case of CSP (Chip Scale Packages), that is to say the range of applications is restricted.

SUMMARY OF THE INVENTION

In one aspect, the invention provides a method that can be carried out easily as well as an arrangement for reliable protection of the chip edges/corners. For example, the preferred embodiment teaches a method of producing a protection means for chip edges on electronic components having no housing, in which semiconductor chips, which are provided with a bonding channel that is open at the side, are mounted on a substrate with the interposition of a tape. For example, the semiconductor chip can be mounted on the substrate using a tape whose outline is smaller than the outline of the semiconductor chip, so that a circumferential undercut is formed as a capillary along the outer edge between the semiconductor chip and the substrate. Aspects of the invention also relate to an arrangement for protection of chip edges.

Embodiments of invention provide a method where a semiconductor chip is mounted on a substrate using a tape whose outline is smaller than the outline of the semiconductor chip, so that a circumferential undercut is formed as a capillary along the outer edge between the semiconductor chip and the substrate. After the production of the electrical connections between the semiconductor chip and the carrier element (e.g., bonding wires), an encapsulant material that can flow is introduced into the bonding channel until the encapsulant material uniformly surrounds the edge of the semiconductor chip. The bonding channel is then completely filled with encapsulant material in a second step.

The process of filling the bonding channel with the encapsulant material in the first step is in this case preferably continued until a uniform material fillet has been formed around the semiconductor chip.

In a further development of the invention, the encapsulant material is briefly heat-treated after the first step, thus preventing the accidental emergence of an excessive amount of material, and preparing for the subsequent installation step.

It is also possible to provide for the encapsulant material to be hardened completely after the second step, which can be achieved by means of a longer heat-treatment step.

In order to ensure that a compression load is exerted on the chip edges after the completion of the electronic component, a further refinement of the invention provides for a material, which shrinks during hardening to be used as the encapsulant material. This results in extremely effective edge protection.

An epoxy/silicone mixture is preferably used as the encapsulant material, which can be introduced well into the bonding channel and has good flowing characteristics.

A further refinement provides for the encapsulant material to be introduced into the bonding channel by printing or dispensing. This allows the bonding channel to be filled quickly and effectively, with the amount of encapsulant material introduced in the first step depending on the component.

Complete protection can then be provided for the electronic component, by printing or molding in subsequent process steps, depending on the intended application.

In another embodiment provides an arrangement for protection of chip edges on electronic components, in which semiconductor chips, which are provided with a bonding channel that is open at the side, are mounted on a substrate with the interposition of a tape. An intermediate space, in the form of a capillary, is located in the area of the outer circumference of the semiconductor chip, between it and the substrate, and is filled with an encapsulant material, and in that a material fillet composed of the encapsulant material extends around the semiconductor chip and encapsulates at least its lower chip edge.

The material fillet, which is composed of the encapsulant material, is preferably at an angle of about 45° to the substrate.

In order to exert a sufficient compression force on the chip edges after completion of the electronic component, the encapsulant material is composed of an epoxy/silicone mixture with shrinking characteristics, with the encapsulant material being integrally formed in the intermediate space and in the material fillet.

The particular advantages of the invention are that the resultant process control and the design (tape design) associated with it result in a material fillet at about 45° composed of a soft encapsulant material, which has a number of objects. First of all, it protects active chip edges against mechanical damage from the exterior and reduces the mechanical stress on the chip edges. The material characteristics of the material that is used mean that a tension load is converted to a compression load on the active chip edge. This is achieved by means of the chemical shrinking process of the material that is used, during hardening. As is known, chip edges are less sensitive to compression loads than to tension loads. A further effect is that fuses are covered, thus preventing environmental influences on the fuses.

The preferred embodiment of the invention thus provides simple edge and corner protection, without any additional material and without any additional equipment. Furthermore, complete protection is possible by means of subsequent method steps such as printing or molding, without air inclusions being able to migrate from the die attach material into the protective cap that is produced by the method according to the invention, or air being introduced by the processes that are carried out in subsequent methods.

In principle, the method according to embodiments of invention can be used for all electronic components in which there is an intermediate space in the form of a capillary between the semiconductor chip and the substrate on which the semiconductor chip is mounted, or in which it is possible to provide such an intermediate space, which can be filled via a bonding channel. For example, the invention allows chipsize packages to be produced using BOC (board on chip) technology without any problems.

BRIEF DESCRIPTION OF THE DRAWINGS

The invention will be explained in more detail in the following text using an exemplary embodiment. In the associated drawing figures.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
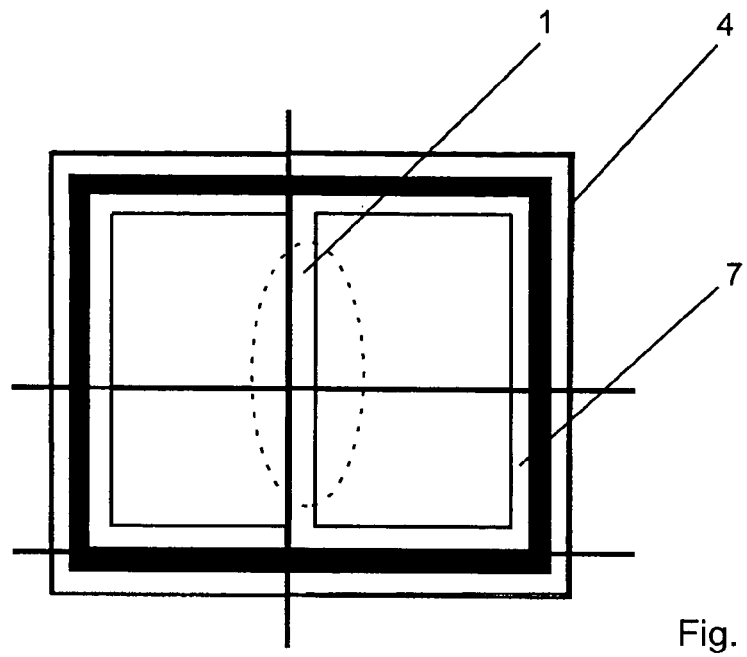
FIG. 1 shows a plan view of an arrangement, produced using the method according to the invention, for protection of chip edges.
Figure 2:
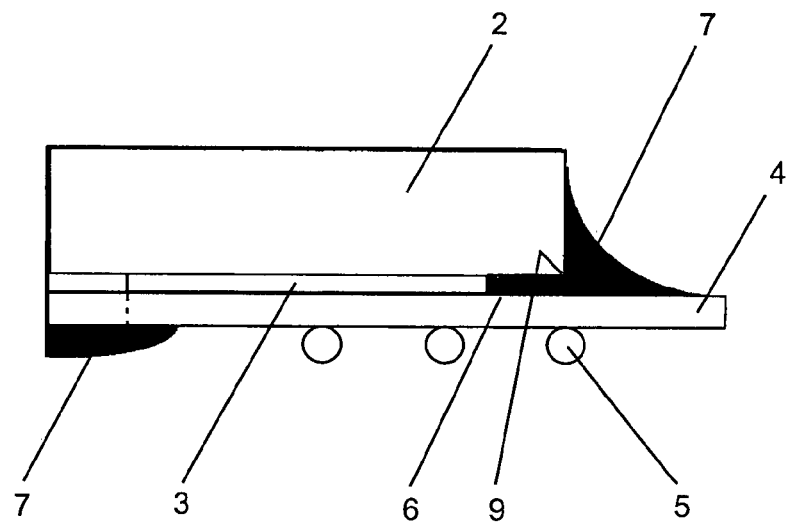
FIG. 2 shows a section according to FIG. 1, section 1.
Figure 3:
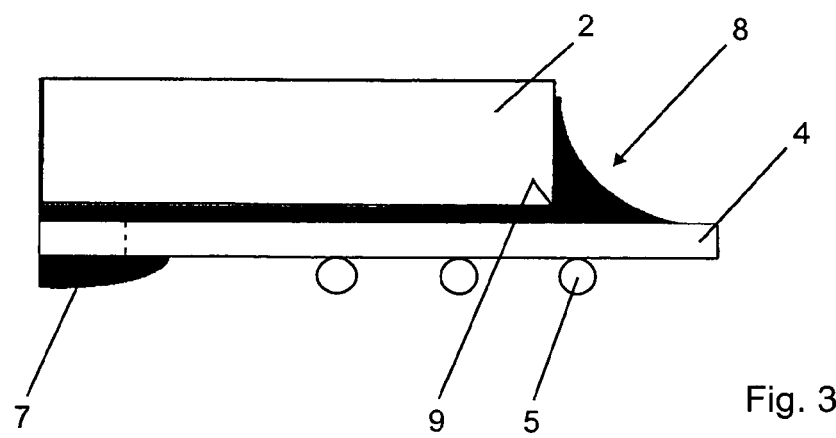
FIG. 3 shows a section according to FIG. 1, section 2.
Figure 4:
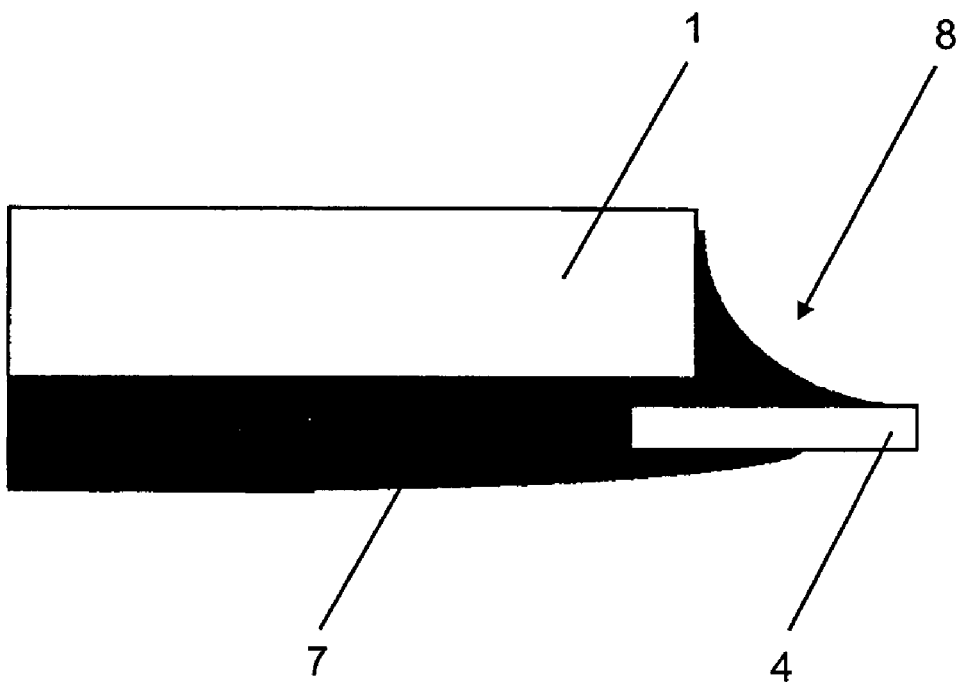
FIG. 4 shows a section according to FIG. 1, section 3.

Referring now to the plan view of FIG. 1 and the cross-sectional view of FIGS. 2–4, the preferred embodiment will be described in the context of a semiconductor chip 2. Semiconductor chip 2, which is provided with a central bonding channel 1 that is open at the side, is mounted on a substrate 4 with the interposition of a tape 3. The substrate 4 is provided with interconnects, which are not illustrated but are normally connected via wire links to the semiconductor chip 2 and are provided with solder balls 5 on the lower face of the substrate 4, by means of which an electrical connection can be produced between the electronic component and the printed circuit boards or the like. An intermediate space 6 in the form of a capillary, which is filled with an encapsulant material 7, is located in the area of the outer circumference of the semiconductor chip 2, between it and the substrate 4. Furthermore, a material fillet 8 composed of the encapsulant material 7 extends around the semiconductor chip 2. This material fillet 8 encapsulates the lower chip edge 9 and forms an angle of about 45° with the substrate 4. This material fillet 8 can also be configured such that it also encloses the upper chip edge.

After production of the electrical connections between the semiconductor chip and the substrate 4 by means of bonding wires in a first step, the material fillet 8 is produced by introducing an encapsulant material 7, which can flow into the bonding channel 1, until this material uniformly surrounds the lower edge 9 of the semiconductor chip 2. The process of filling the bonding channel 1 with the encapsulant material 7 is in this case preferably continued until a uniform material fillet 8 has been formed around the semiconductor chip 2. The encapsulant material 7 that has been introduced is then briefly heat-treated, thus preventing accidental emergence of an excessive amount of material, and preparing for the subsequent installation step.

It is also possible to provide for the encapsulant material 7 to be hardened completely after the first step, which can be achieved by a longer heat-treatment step.

The bonding channel 1 is then completely filled with encapsulant material 7, so that all of the wire links, which extend through the bonding channel, are also encapsulated.

In order to ensure that a compression load is exerted on the chip edges after the completion of the electronic component, a material, which shrinks during hardening, for example an epoxy/silicone mixture, which has good flowing characteristics, is used as the encapsulant material 7.

The encapsulant material 7 can be introduced into the bonding channel 1 by printing or dispensing, so that the bonding channel 1 can be filled quickly and effectively, in which case the amount of encapsulant material 7 introduced in the first step can also be dependent on the component.

The following provides a list of reference numerals that correspond to the figures:

| | |
|---|---|
| 1. | Bonding channel |
| 2 | Semiconductor chip |
| 3 | Tape |
| 4 | Substrate |
| 5 | Solder ball |
| 6 | Intermediate space |
| 7 | Encapsulant material |
| 8 | Material fillet |
| 9 | Lower chip edge |

Although the present invention and its advantages have been described in detail, it should be understood that various changes, substitutions and alterations can be made herein without departing from the spirit and scope of the invention as defined by the appended claims.

What is claimed is:

1. A method for manufacturing an electronic component, the method comprising:
   mounting a semiconductor chip with a bonding channel on a substrate, the mounting being performed using an adhesive with an outline that is smaller than an outline of the semiconductor chip so that a circumferential undercut is formed along an outer edge between the semiconductor chip and the substrate;
   forming electrical connections between the semiconductor chip and the substrate;
   introducing an encapsulant material that can flow into the bonding channel until the encapsulant material uniformly surrounds the edge of the semiconductor chip and forms a material fillet;
   heat-treating the encapsulant material;
   subsequently, introducing additional encapsulant material into the bonding channel so that the bonding channel is completely filled with encapsulant material; and hardening the encapsulant thereby causing the encapsulant to shrink.

2. The method of claim 1 wherein forming electrical connections comprises forming bond wires between the semiconductor chip and the substrate.

3. The method of claim 1 wherein hardening the encapsulant material comprises hardening the encapsulant by heat treatment.

4. The method of claim 3 wherein the encapsulant material comprises an epoxy/silicone mixture.

5. The method of claim 1 wherein the encapsulant material is introduced into the bonding channel by printing or dispensing.

6. The method of claim 1 wherein complete protection for the electronic component is produced by printing or molding in subsequent process steps.

7. A method of protecting chip edges on electronic components, in which semiconductor chips, which are provided with a bonding channel that is open at the side, are mounted on a substrate with the interposition of a tape, the semiconductor chip being mounted on the substrate using a tape whose outline is smaller than the outline of the semiconductor chip, so that a circumferential undercut is formed as a capillaiy along the outer edge between the semiconductor chip and the substrate, wherein, after the production of the electrical connections between the semiconductor chip and the substrate by means of bonding wires in a first step, an encapsulant material which can flow and shrinks during hardening is introduced into the bonding channel until the encapsulant material uniformily surrounds the edge of the semiconductor chip so as to form a material fillet, the encapsulant is then heat-treated, and in that the bonding channel is subsequently completely filled with encapsulant material in a second step.

8. The method as claimed in claim 7, wherein the encapsulant material is hardened after the second step.

9. The method as claimed in claim 8, wherein the encapsulant material is hardened by heat treatment.

10. The method as claimed in claim 9, wherein the encapsulant material comprises an epoxy/silicone mixture.

11. The method as claimed in claim 7, wherein the encapsulant material is introduced into the bonding channel by printing or dispensing.

12. The method as claimed in claim 7, wherein the amount of encapsulant material which is introduced in the first step depends on the component.

13. The method as claimed in claim 7, wherein complete protection for the electronic component is produced by printing or molding in subsequent process steps.

* * * * *